(12) United States Patent
Hasunuma et al.

(10) Patent No.: US 7,067,922 B2
(45) Date of Patent: Jun. 27, 2006

(54) SEMICONDUCTOR DEVICE

(75) Inventors: Masahiko Hasunuma, Yokohama (JP); Akitsugu Hatazaki, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/809,418

(22) Filed: Mar. 26, 2004

(65) Prior Publication Data
US 2004/0245642 A1    Dec. 9, 2004

(30) Foreign Application Priority Data
Mar. 27, 2003   (JP) .......................... P2003-088908

(51) Int. Cl.
*H01L 23/48* (2006.01)
(52) U.S. Cl. ...................... 257/758; 257/701; 257/709
(58) Field of Classification Search ................ 257/701, 257/709, 758
See application file for complete search history.

(56) References Cited

U.S. PATENT DOCUMENTS

| 5,296,745 A | 3/1994 | Shirai et al. |
| 6,424,051 B1 | 7/2002 | Shinogi et al. |
| 6,465,112 B1 | 10/2002 | Ikura |
| 6,538,301 B1 | 3/2003 | Yamada et al. |

FOREIGN PATENT DOCUMENTS

| JP | 6-188240 | 7/1994 |
| JP | 2000-277465 | 10/2000 |
| JP | 2002-353307 | 12/2002 |

OTHER PUBLICATIONS

Notification of the First Office Action issued by the Chinese Paten Office, mailed Dec. 9, 2005, for Chinese Patent Application No. 200410029643.5, and English-language translation thereof.

*Primary Examiner*—Long Pham
(74) *Attorney, Agent, or Firm*—Finnegan, Henderson, Farabow, Garrett & Dunner, L.L.P.

(57) ABSTRACT

Disclosed is a semiconductor device including: a semiconductor substrate; at least one layer of a first insulating film formed above the semiconductor substrate and having a relative dielectric constant of 3.8 or less, an entire layer of the first insulating film being separated at least near four corners of the semiconductor substrate by a lacking portion that extends along the four corners; and a second insulating film covering a side face of the entire layer of the first insulating film in the lacking portion on a center side of the semiconductor substrate and having a relative dielectric constant of over 3.8.

25 Claims, 8 Drawing Sheets

SEMICONDUCTOR DEVICE

CROSS REFERENCE TO THE INVENTION

This application is based upon and claims the benefit of priority from the prior Japanese Patent Application No. 0.2003-88908, filed on Mar. 27, 2003; the entire contents of which are incorporated herein by reference.

BACKGROUND

1. Field of the Invention

The present invention relates to a semiconductor device, and more particularly, to a semiconductor device having an insulating film whose relative dielectric constant is 3.8 or lower.

2. Description of the Related Art

As a structure of a semiconductor device (semiconductor chip) having an interlayer insulating film in which a side face of the interlayer insulating film, namely, the peripheral edge of the semiconductor chip is sealed for improving reliability, that disclosed in the following patent document 1 is an example. In this example, conductors made of the same material as that of wirings are used for seal members. In a manufacturing process thereof, the seal members are formed on the side faces of the interlayer insulating films, and thereafter, a semiconductor wafer is diced to semiconductor chips.

[Patent Document 1]

Japanese Patent Laid-open No. 2000-277465.

For the purpose of further improving the operating speed of a semiconductor device, decrease in wiring resistance, reduction in dielectric constant of an interlayer insulating film, and so on have been promoted in recent years. Specifically, copper (Cu) is replacing aluminum (Al) as the material of the wiring. As the interlayer insulating film, the adoption of a low dielectric constant insulating film (low-k film) such as a $SiO_2$ film doped with fluorine or a $SiO_2$ film containing an organic component is being promoted in place of the adoption of a simple $SiO_2$ film.

The low dielectric constant insulating film is obtained by, for example, reduction in material density, exclusion of a dielectric polarization property in the material, or the like. The reduction in material density is achieved by, for example, making the material porous, but such a low dielectric constant insulating film is low in mechanical physical value such as Young's modulus and hardness. This means that the low dielectric constant insulating film is generally low in mechanical strength of its material itself.

Some low dielectric constant insulating film adopts a film structure low in polarity in order to lower a relative dielectric constant in the film. This structure decreases adhesion strength on interfaces of layered films in which low dielectric constant insulating films are layered or a low dielectric constant insulating film and a different film are layered.

The low mechanical strength of the low dielectric constant insulating film itself and the low adhesion strength on the interfaces of the layered films including the low dielectric constant insulating film may possibly be factors of causing problems in subsequent processes. As a result, reliability as a semiconductor device may possibly be impaired. Note that the aforesaid patent document 1 does not indicate any measure to be taken against the low mechanical strength of the interlayer insulating films and the low adhesion strength on the interfaces.

SUMMARY

A semiconductor device according to one aspect of the present invention includes: a semiconductor substrate; at least one layer of a first insulating film formed above the semiconductor substrate and having a relative dielectric constant of 3.8 or less, an entire layer of the first insulating film being separated at least near four corners of the semiconductor substrate by a lacking portion that extends along the four corners; and a second insulating film covering a side face of the entire layer of the first insulating film in the lacking portion on a center side of the semiconductor substrate and having a relative dielectric constant of over 3.8.

A semiconductor device according to another aspect of the present invention includes: a semiconductor substrate; at least one layer of a first insulating film formed above the semiconductor substrate and having a relative dielectric constant of 3.8 or less, an entire layer of the first insulating film being separated at least near four corners of a semiconductor chip by a lacking portion that extends along the four corners; and a second insulating film formed in the lacking portion and on the first insulating film and having a relative dielectric constant of over 3.8.

DETAILED DESCRIPTION

EXPLANATION OF EMBODIMENTS

Figure 1A:
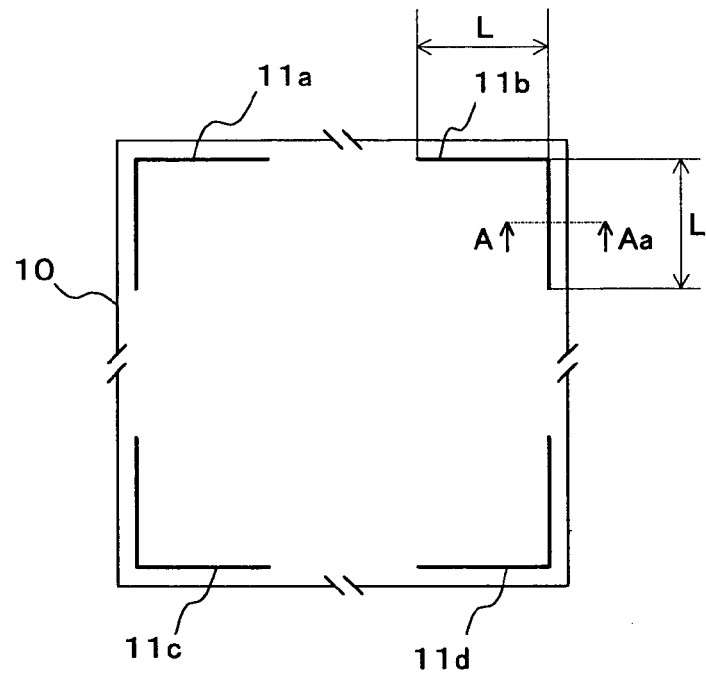
FIG. 1A and FIG. 1B are schematic views showing the structure of a semiconductor device according to an embodiment of the present invention.

In a semiconductor device according to one aspect of the present invention, a low dielectric constant insulating film, namely, an insulating film having a relative dielectric constant of 3.8 or less is separated at least near four corners of a semiconductor substrate by lacking portions that extend along the four corners. Further, a side face the insulating film in the lacking portion on a center side of a semiconductor substrate is covered with a second insulating film having a relative dielectric constant of over 3.8.

With such a structure, peeling and breakage of the low dielectric constant insulating film caused by cutting at the time of dicing does not spread to the center side of the semiconductor device owing to this separation. Further, the side faces of the insulating film in the lacking portions on the semiconductor substrate center side are covered with the second insulating film having a relative dielectric constant of over 3.8, so that environment resistance such as moisture resistance is enhanced and mechanical strength is also improved. Consequently, a semiconductor device having resistance against peeling and breakage of the insulating film and having improved reliability is provided.

In a semiconductor device according to another aspect of the present invention, a second insulating film having a relative dielectric constant of over 3.8 is formed in lacking portions and on a first insulating film. Therefore, the same effects are obtained.

Incidentally, as the low dielectric constant insulating film having a relative dielectric constant of 3.8 or less, available are a $SiO_2$ film doped with fluorine (SiOF film: k=3.4 to 3.7), an organic silica film (k=2.5 to 3.0), a MSQ film (methyl silsesquioxane film: k=2.7 to 3.0, and in a porous state, k=2.0 to 2.5), a HSQ film (hydrogen silsesquioxane film: k=3.5 to 3.8, and in a porous state, k-2.2), a PAE film (polyarylether film: k=2.7 to 2.9, and in a porous state, k=2.0 to 2.2), a PTFE film (polytetrafluoroethylene film: k=2.1), and so on. Incidentally, a Young's modulus of, for example, the $SiO_2$ film doped with fluorine is about 40 GPa, which is a relatively small value. As the second insulating film having a relative dielectric constant of over 3.8, one appropriately selected from $SiO_2$, SiN, SiC, SiCN, and so on is usable.

Here, the lacking portions of the insulating film can be formed by, for example, a RIE (reactive ion etching) process, but also usable in place thereof is a trench forming method such as a laser ablation process by which the formation of large or minute cracks that will be starting points of peeling is caused neither on the insulating films themselves nor on interfaces thereof. In the RIE process, a smooth process is possible, and the laser ablation process, which is a process utilizing an ablation effect, has an advantage of preventing cracks in the insulating films and an advantage of strengthening the interfaces because a side face is made smooth by a heat reflow effect.

Various kinds of techniques have been proposed to dice portions including insulating layers on a substrate, namely, portions on which multiple wiring layers are formed, but in a typical method, conventional or modified mechanical cutting with a diamond blade is used at least for finally cutting Si or the like as the substrate. In the above-described semiconductor device according to the one aspect of the present invention, it is also possible to protect a semiconductor device from mechanical damage that occurs in a technique of using a diamond blade only for dicing a substrate such as Si.

The inventors of the present invention have found out that the use of a low-k film whose relative dielectric constant is 3.8 or less as an insulating film (interlayer insulating film) formed above a semiconductor substrate causes film peeling and film breakage in a process of packaging semiconductor chips, resulting in a significant problem. The major cause of the film peeling and the film breakage is that many starting points of peeling are made on end faces of semiconductor chips when dicing is conducted to make small pieces of semiconductor chips.

More specifically, the major cause is that the dicing with a diamond blade itself is a crushing process, and consequently, the interfaces of insulating films on a cut face or the insulating films themselves suffer great breaking damage, so that many starting points of peeling are made. Such breaking damage occurs more frequently especially in the structure in which wirings are formed in multilayers, namely, the structure in which insulating layers including wirings are formed in multilayers.

The above-described semiconductor device according to the one aspect of the present invention eliminates the influence by the aforesaid damage in the vicinity of the four corners of the semiconductor substrate where the degree of stress concentration in a packaging process is high, so that substantially no starting point of peeling of the insulating film is made.

Figure 7:
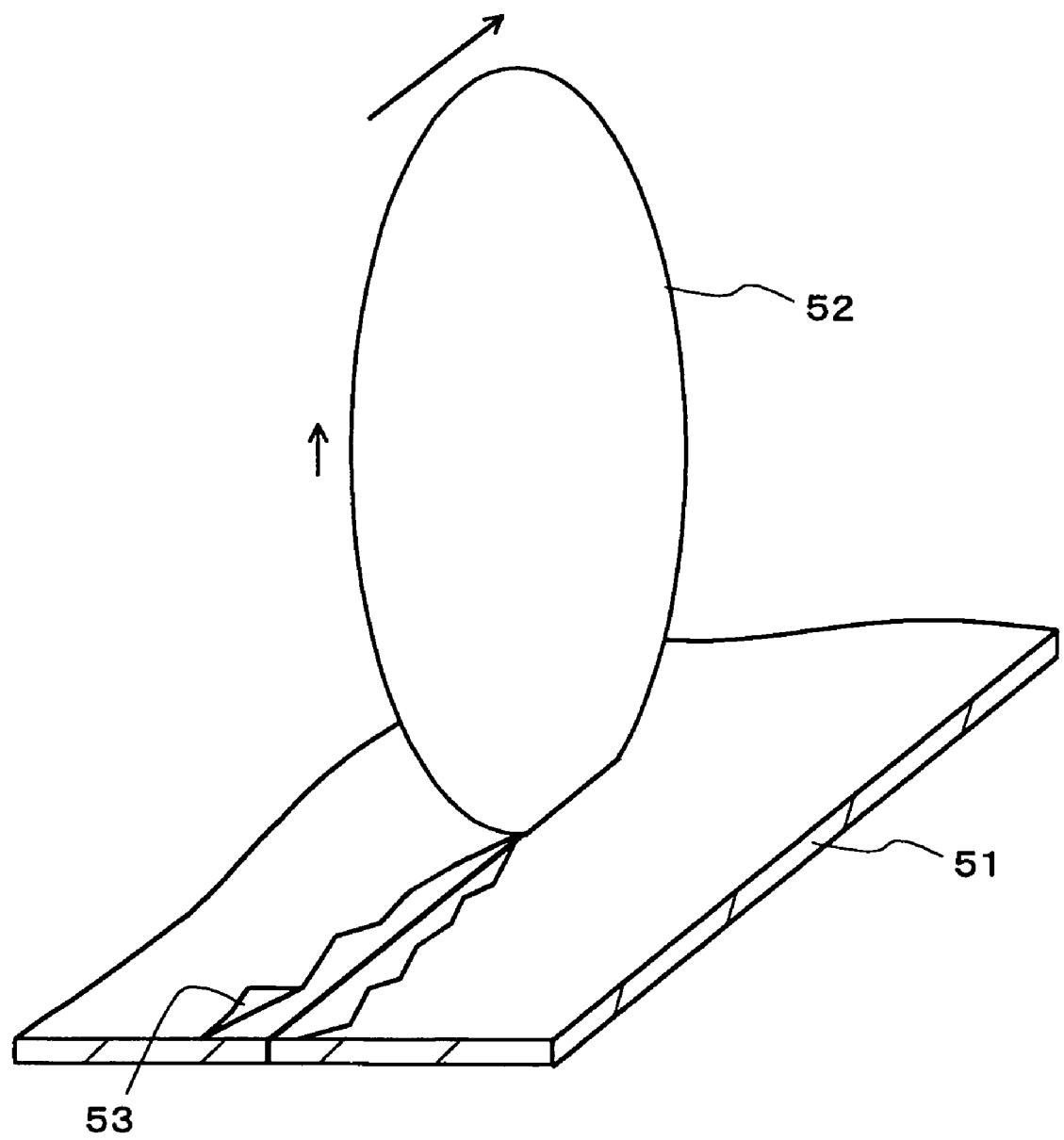
FIG. 7 is a reference view schematically showing a process of dicing a semiconductor wafer.

An example of the breaking damage will be explained with reference to FIG. 7. FIG. 7 is a reference view schematically showing a process of dicing a semiconductor wafer with a diamond blade. As shown in FIG. 7, when a semiconductor wafer 51 on which many semiconductor devices having multilayered wirings are formed is diced, a blade 52 containing diamond also cuts insulating films including the multilayered wirings formed on the semiconductor substrate. Here, if the insulating films are low-k films, the occurrence of a minute peeling 53 is observed in the insulating films as shown in FIG. 7. Thereafter, when resin sealing is conducted in a packaging process, the peeling spreads due to generated heat stress, and when a TCT (temperature cycle test) is further conducted thereafter, a considerable number of semiconductor chips become defective in terms of peeling of the insulating films.

Incidentally, in order to overcome such fault occurrence, it is considered as having at least a certain extent of significance to improve film strength of a low dielectric constant insulating film and adhesion strength on interfaces of layered films including the low dielectric constant insulating film by an interface treatment technique and optimization of processes at the time of a RIE process. It is also considered as having at least a certain extent of significance to control grain size of abrasive grains for dicing, thereby reducing the breaking damage and to dispose a metal guard ring near the periphery of each semiconductor chip, thereby preventing the progress of the peeling therein.

The inventors of the present invention have also found out that improvement in environment resistance is required since a low-k film is high in moisture permeability and therefore moisture and process gas enter from its dicing cut face and peeled face to cause corrosion of barrier metal and Cu wirings. For this purpose, it may be possible to block the permeation of environmental factors such as moisture by a metal guard ring. However, since the material of this guard ring itself is low in corrosion resistance, the inventors have reached a conclusion that a measure for further improving resistance is required in view of long-term maintenance of reliability.

Further, a technique utilizing laser ablation is coming into practical use as a dicing process in recent years. However, even in the case where this method is utilized, a diamond blade is used for dicing a semiconductor substrate itself such as Si after insulating layers are processed, and therefore, the inventors have reached a conclusion that it is concerned that crushed pieces may give damage to an exposed low-k film, which may become the starting point of peeling.

As one form, the lacking portion in the first insulating film may be formed near an entire peripheral edge of the semiconductor substrate. The lacking portion is formed in a ring shape, so that the occurrence of the damage in the first insulating film is further reduced.

In a semiconductor device as another form, the second insulating film may cover a side face of the entire layer of the first insulating film in the lacking portion also on a peripheral edge side of the semiconductor substrate. The second insulating film formed in the lacking portions on the peripheral edge of the semiconductor substrate serves as a barrier for blocking the progress of the peeling into a chip, so that resistance against film peeling and film breakage is further improved.

A semiconductor device as still another form may further include a conductor film formed on the second insulating film in the lacking portion. This structure is an example where the second insulating film is not an outer most film (a so-called passivation film).

A semiconductor device as yet another form may further include a third insulating film formed on the conductor film and having a relative dielectric constant of over 3.8. The third insulating film is, for example, a passivation film. The third insulating film may be constituted of a plurality of layers.

In a semiconductor device as yet another form, the second insulating film may also cover a top face of the first insulating film, and the semiconductor device may further include a conductor pattern passing through the second insulating film on the top face of the first insulating film. With the second insulating film as an interlayer insulating film, for example, a wiring is formed in the second insulating film. The second insulating film may be constituted of a plurality of layers.

A semiconductor device as yet another form may further include a conductor pattern buried in the first insulating film. With the first insulating film as an interlayer insulating film, for example, a wiring is formed in the first insulating film.

As yet another form, the conductor pattern may contain copper. Copper realizes the formation of, for example, a low resistance wiring.

As yet another form, the first insulating film may be constituted of a plurality of layers. The plural layers realize, for example, multilayered wirings.

As yet another form, the lacking portion in the first insulating film has a width of 0.5 μm or more. This width falls within a preferable range obtained by experiments.

As yet another form, the first insulating film on a peripheral edge side of the semiconductor substrate has a width of 0.5 μm or more from the lacking portion. The same as above applies to this width.

As yet another form, a side of the lacking portion in the first insulating film has a length of 1 mm or more. The same as above also applies to this length.

Figure 1B:
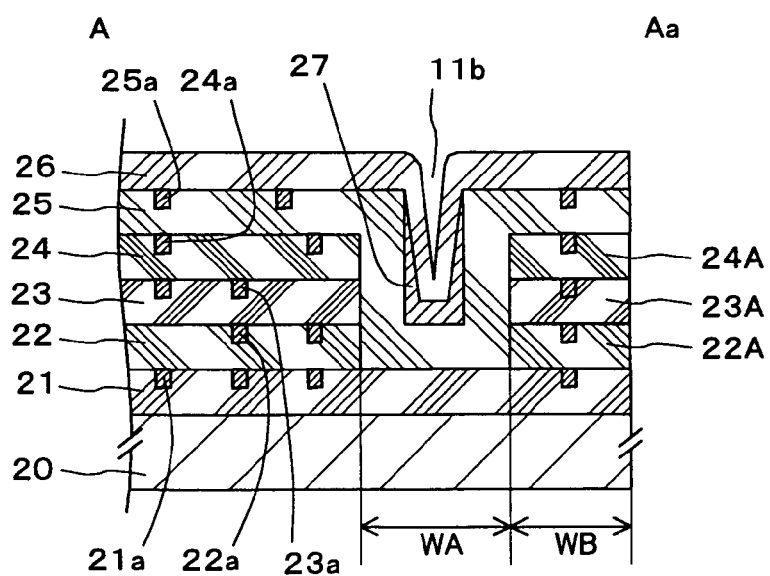

Based on the foregoing, embodiments of the present invention will be hereinafter explained with reference to the drawings. FIG. 1A and FIG. 1B are views schematically showing the structure of a semiconductor device according to an embodiment of the present invention. FIG. 1A is a top view and FIG. 1B is a cross-sectional view taken along the A–Aa line in FIG. 1A. The semiconductor device shown here is in a state of a so-called bare chip. This is later packaged and mounted as required.

As shown in FIG. 1A, this semiconductor device has, near four corners of a semiconductor chip 10, L-shaped recessions 11a, 11b, 11c, 11d extending along the four corners. Here, the length of a side of the L shape is defined as L. A cross section near the recessions 11a, 11b, 11c, 11d has the structure as shown in FIG. 1B. Specifically, an interlayer insulating film 21 is formed on the substantially entire surface on a semiconductor substrate 20, and patterns of lower wirings 21a made of metal such as copper are buried in the interlayer insulating film 21. The interlayer insulating film 21 is not a so-called low-k film but has a relative dielectric constant of over 3.8 (hereinafter, an interlayer insulating film with a relative dielectric constant of over 3.8 is referred to also as a "normal interlayer insulating film").

On an upper side of the interlayer insulating film 21, interlayer insulating films 22, 23, 24 as the first insulating film are layered in sequence, and these interlayer insulating films 22, 23, 24 are separated by lacking portions provided along the vicinity of the four corners of the semiconductor chip 10 and passing through these interlayer insulating films 22, 23, 24. Areas outside the lacking portions are sacrifice portions 22A, 23A, 24A of the interlayer insulating films, respectively. Note that outer side faces of the sacrifice portions 22A, 23A, 24A in FIG. 1B correspond to dicing cut faces when the semiconductor wafer is diced as shown in FIG. 7. Here, the width of each of the lacking portions is defined as WA, and the width of each of the sacrifice portions 22A, 23A, 24A is defined as WB. Areas on an inner side than the lacking portions are used as so-called active regions, and elements such as transistors, though not shown, are formed on the substrate 26.

The interlayer insulating films 22, 23, 24 and the sacrifice portions 22A, 23A, 24A are low-k films, those having corresponding numbers (reference numerals and symbols) being formed through a synchronous process. The relative dielectric constant thereof is, for example, 2.7, and porous films having a low Young's modulus, for example, 5 GPa are used.

Patterns of wirings 22a, 23a, 24a made of metal such as copper are buried in the interlayer insulating films 22, 23, 24, respectively. These wirings 22a, 23a, 24a constitute multilayered wirings. Though structures for electrically connecting the wirings in the respective layers (interlayer connection) to one another also exist, but they are not shown (to be explained in later described drawings). Incidentally, conductor portions made of the same material as that of the wirings 22a, 23a, 24a are formed also in the sacrifice portions 22A, 23A, 24A, but they are formed, for example, as dummy patterns for mask alignment in manufacturing processes and as patterns for dicing TEG (test element group).

An upper interlayer insulating film 25 as the second insulating film is formed on an upper side of the interlayer insulating films 22, 23, 24 and the sacrifice portions 22A, 23A, 24A, on a bottom face of the lacking portions, and on side faces of the interlayer insulating films 22, 23, 24 and the sacrifice portions 22A, 23A, 24A in the lacking portions. The interlayer insulating film 25 is a normal interlayer insulating film. Patterns of upper wirings 25a made of metal such as copper or aluminum are buried in the interlayer insulating film 25. Further, a metal film 27 is layered on the side faces and bottom faces of the interlayer insulating film 25 in the lacking portions. This metal film 27 is formed at the same time when the wirings 25a are formed. Further, a passivation film 26 is formed on the entire surface of the uppermost layer excluding not-shown pad portions, and the recessions 11b and so on originated from the lacking portions provided in the interlayer insulating films 22, 23, 24 are formed on the surface of this passivation film 26 along the vicinity of the four corners of the semiconductor chip.

With such a structure, namely, the structure having the sacrifice portions 22A, 23A, 24A provided outside the lacking portions (on a dicing line side) of the low-k interlayer insulating films 22, 23, 24, it is possible to protect the low-k interlayer insulating films 22, 23, 24 from mechanical damage caused by crushed pieces at the dicing time. Moreover, film peeling of the sacrifice portions 22A, 23A, 24A starting from cracks that occur on the dicing line is blocked by the lacking portions, so that the peeling of the sacrifice portions 22A, 23A, 24A, even if it should occur, is prevented from progressing into the semiconductor chip 10.

Further, side faces of the interlayer insulating films 22, 23, 24 in the lacking portions on a semiconductor substrate 20 center side are covered with the interlayer insulating film 25 with a relative dielectric constant of over 3.8. This structure realizes not only improvement in environment resistance such as moisture resistance but also enhancement in mechanical strength. Moreover, the interlayer insulating film 25 with a relative dielectric constant of over 3.8 also covers side faces of the sacrifice portions 22A, 23A, 24A on a lacking portion side, and thus serves as a barrier for blocking the progress of the peeling occurring in the sacrifice portions 22A, 23A, 24A into an internal area, which enhances resistance against film peeling and film breakage. Further, the metal film 27 and the passivation film 26 are layered on the interlayer insulating film 25 with a relative dielectric constant of over 3.8 in the lacking portions. Therefore, these films are usable as so-called guard rings, which makes the improvement in environment resistance and resistance against film peeling, film breakage, and so on more prominent.

In this embodiment, the lacking portions are provided only along portions near the four corners of the semiconductor chip 10. This is because these portions are portions where large stress is generated due to structural characteristics when a packaging process is conducted and when the package is used as the semiconductor device. In other words, in view of peeling and breakage of the interlayer insulating films 22, 23, 24 caused by stress generation, these portions are especially important. Incidentally, in the example shown here, three layers of the low-k interlayer insulating films having the wirings (interlayer insulating films 22, 23, 24) are formed, but the number of layers can be further increased in a similar manner. Further, the interlayer insulating film with a relative dielectric constant of over 3.8 (normal interlayer insulating film 21) under the low-k interlayer insulating films may be omitted.

Next, a manufacturing method of the semiconductor device shown in FIG. 1A and FIG. 1B will be explained below with reference to FIG. 2A to FIG. 4. FIG. 2A to FIG. 4 are views showing processes of manufacturing the semiconductor device shown in FIG. 1A and FIG. 1B. In these drawings, the same reference numerals and symbols are used to designate portions that are the same as or corresponding to the portions shown in FIG. 1A and FIG. 1B.

Figure 2A:
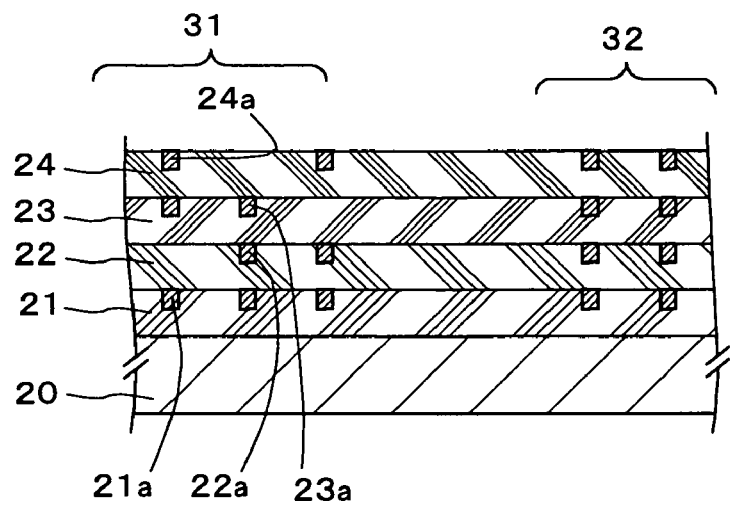
FIG. 2A, FIG. 2B, and FIG. 2C are views showing processes of manufacturing the semiconductor device shown in FIG. 1A and FIG. 1B.

First, the structure shown in FIG. 2A is formed. Specifically, the interlayer insulating films 21, 22, 23, 24 and the wirings 21*a*, 22*a*, 23*a*, 24*a* in these interlayer insulating films 21, 22, 23, 24 are layered on the active regions 31, alignment mark arranging regions 32, and further not-shown dicing lines of the semiconductor substrate 20 that is not diced yet. The alignment mark arranging regions 32 are regions in which dummy patterns (alignment marks) for, for example, mask alignment are formed. Regions for forming the lacking portions are provided between the active regions 31 and the alignment mark arranging regions 32.

More specifically, elements such as transistors are formed on the active regions 31 on the substrate 20 by a known method, and thereafter, the normal interlayer insulating film 21 and the lower wirings 21*a* are formed on the substrate 20. Further, the low-k interlayer insulating films 22, 23, 24 and the wirings 22*a*, 23*a*, 24*a* are formed in sequence. The interlayer insulating films 22, 23, 24 used here are films with a relative dielectric constant of 2.7, a Young's modulus of 5 GPa, and a linear expansion coefficient of 40 ppm/° C.

Figure 2B:
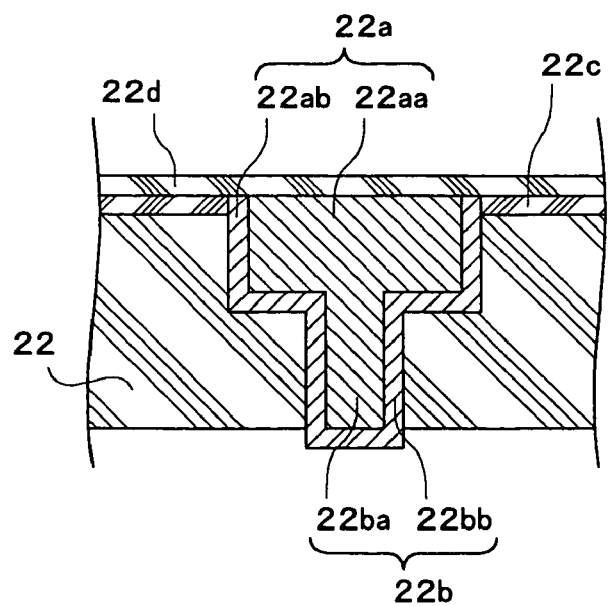

FIG. 2B shows the structure of the interlayer insulating film 22 including the wirings 22*a* in a little more detail. The interlayer insulating film 22 is formed, and on the interlayer insulating film 22, a capping film 22*c* made of $SiO_2$ or the like of d-TEOS (d-tetraethyl orthosilicate glass) is formed. Thereafter, a lithography technique and a RIE method are applied to the interlayer insulating film 22 and the capping film 22*c* to form via holes and trenches. Vias (interlayer connection) 22*b* are formed in the via holes and the wirings 22*a* are formed in the trenches.

After the via holes and the trenches are formed, barrier conductor portions 22*ab*, 22*bb* made of, for example, tantalum (Ta) and a Cu seed layer are formed in this order by a PVD (physical vapor deposition) method on the entire surface including inner walls of the via holes and inner walls of the trenches. Then, a copper (Cu) film is formed by electrolytic plating to fill the via holes and the trenches with copper, thereby forming via body portions 22*ba* and wiring body portions 22*aa*.

Subsequently, desired heat treatment (annealing) is applied to the formed copper film, and thereafter, the excessive copper film and barrier conductor film on the capping film 22*c* are removed by a CMP (chemical mechanical polishing) method. Further, a cleaning process is conducted and a top barrier film 22*d* made of SiCN or the like is formed to, for example, 50 nm on the entire surface. The top barrier film 22*d* is an insulating film and is removed at positions requiring connection to vias positioned above when via holes are formed in the upper interlayer insulating film 23. Note that the vias connected to the respective wirings 22*a* and so on are omitted in the drawings except in FIG. 2B.

The wirings 21*a*, 23*a*, 24*a* of the other interlayer insulating films 21, 23, 24 are formed in the same manner as the wirings 22*a* and the vias 22*b* described above. However, the interlayer insulating film 21 out of these films is a normal interlayer insulating film, and the existence or not of the capping film and the like in this layer need not be the same as those in the above description. Thus, processes of forming the interlayer insulating films 21, 22, 23, 24 in sequence from a lower layer and forming the wirings 21*a*, 22*a*, 23*a*, 24*a* at the respective formation of the interlayer insulating films 21, 22, 23, 24 are repeated. Incidentally, in the processes shown here, the multiple wiring layers with the dual damascene structure shown in FIG. 2B are formed by a so-called Cu damascene technique, but a wiring layer with a single damascene structure may be formed. Further, the wiring material may be Al, Ag, or the like, and the wirings may be patterned by a lithography technique and a RIE method.

Figure 2C:
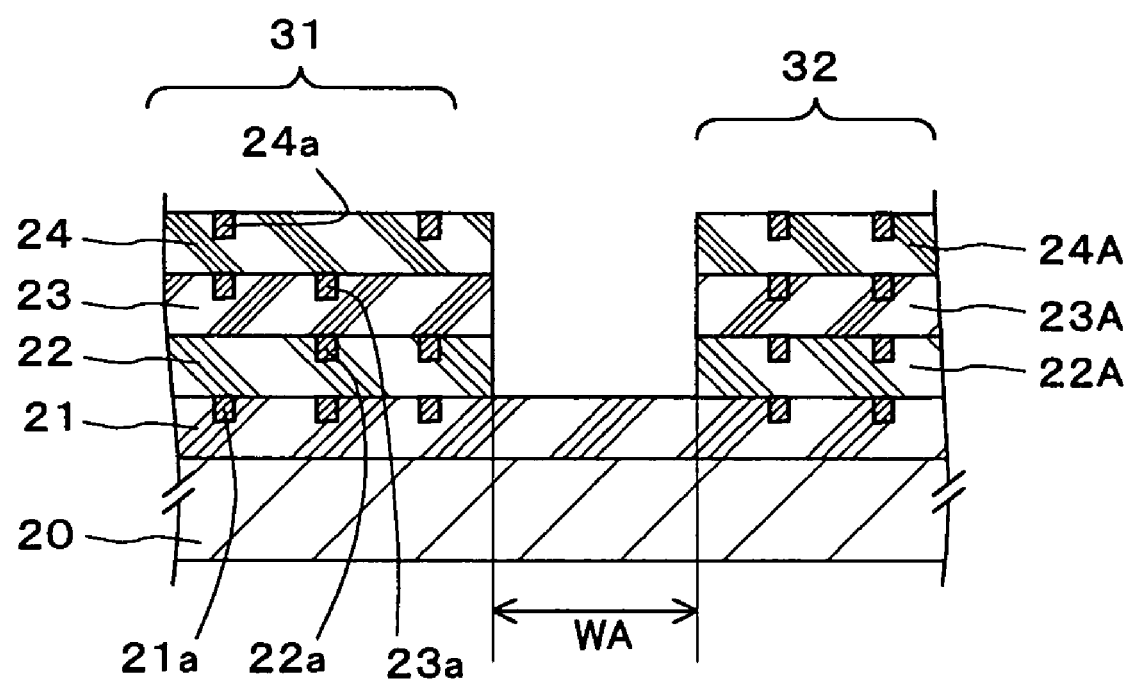

Next, as shown in FIG. 2C, the lacking portions having a width WA of, for example, 0.5 μm are formed by a lithography technique and a RIE method near four corners of the semiconductor chip in portions positioned inner than the alignment mark arranging regions 32 until the lacking portions reach the interlayer insulating film 21 positioned under the low-k interlayer insulating films 22, 23, 24. Through these processes, the sacrifice portions 22A, 23A, 24A are formed outside the lacking portions in a separated manner. Incidentally, here, the lacking portions may be formed to pass also through the interlayer insulating film 21. Further, a process by laser ablation may be conducted instead of the aforesaid RIE method.

Figure 3A:
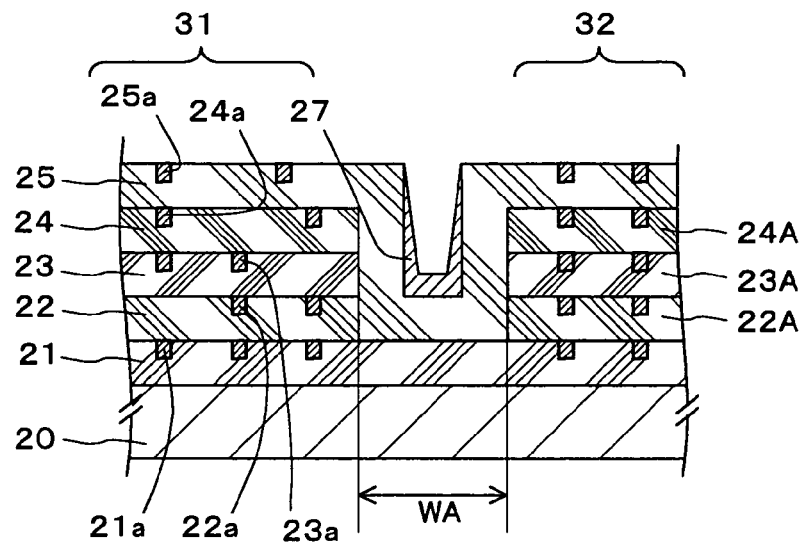
FIG. 3A and FIG. 3B, which are views subsequent to FIG. 2C, are views showing processes of manufacturing the semiconductor device shown in FIG. 1A and FIG. 1B.
Figure 3B:
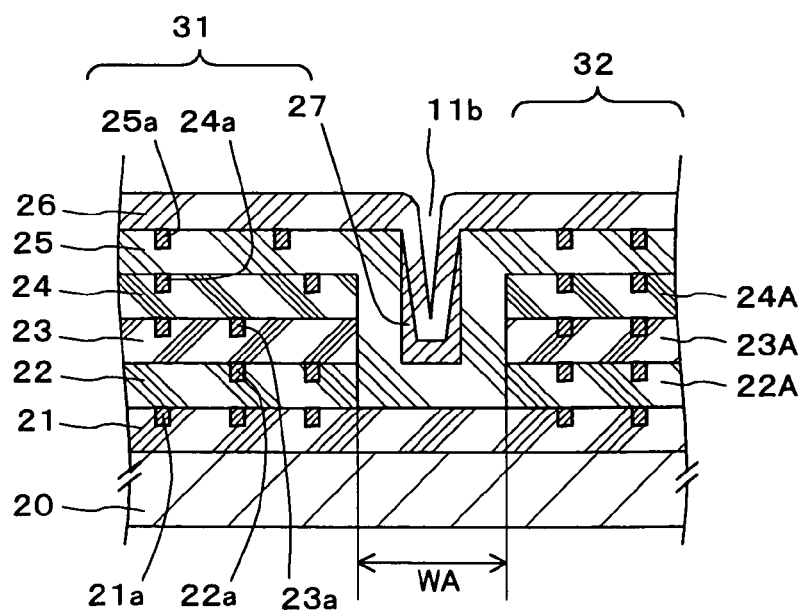

Next, as shown in FIG. 3A, the interlayer insulating film 25 having the upper most layer wirings is formed of d-TEOS (having a relative dielectric constant of about 4.2). This interlayer insulating film 25 also covers the bottom faces and side faces of the abovementioned lacking portions. Then, the wirings 25*a* having the same structure as that of the wirings 22*a* are formed in the interlayer insulating film 25. At this time, the metal films 27 made of copper are formed on side faces and bottom faces of the interlayer insulating film 25 positioned in the lacking portions. Further, as shown in FIG. 3B, the passivation film 26 made of SiN or the like is formed on the entire surface by, for example, plasma CVD (chemical vapor deposition).

Figure 4:
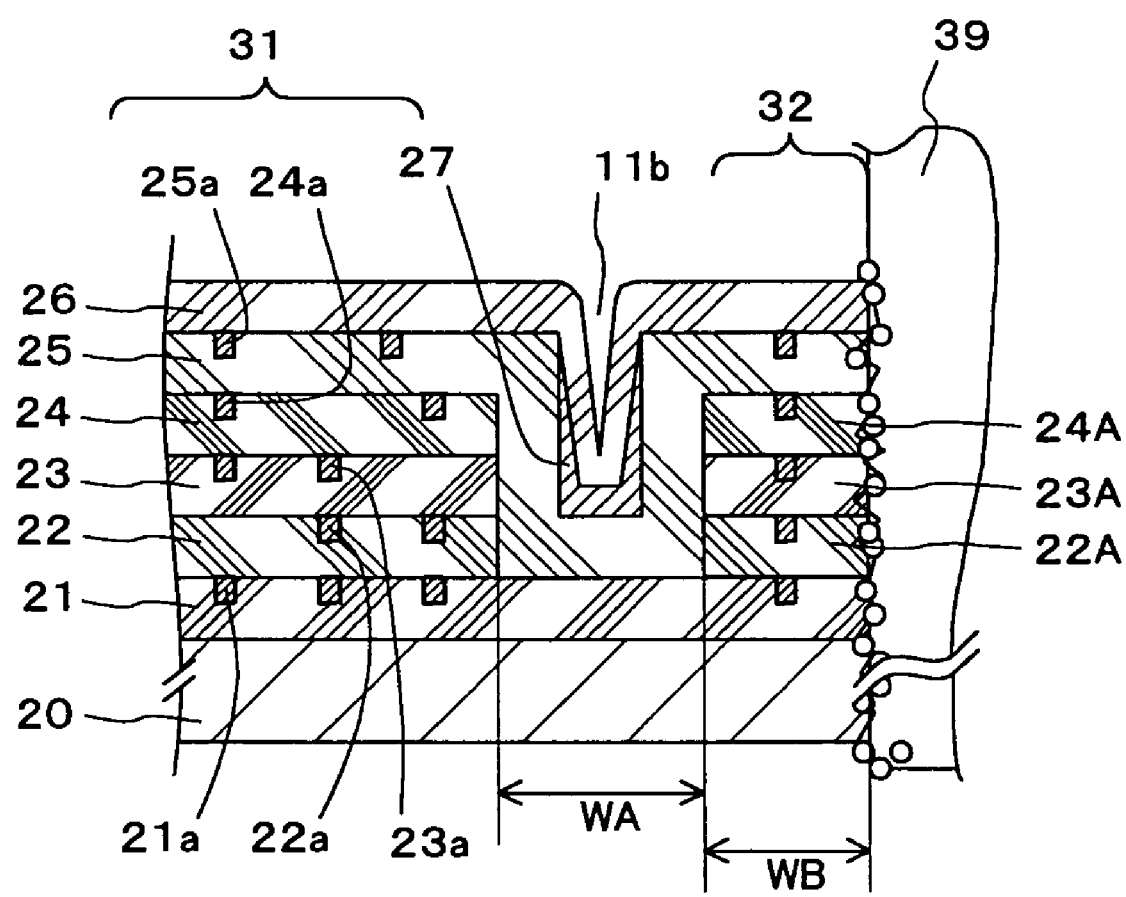
FIG. 4, which is a view subsequent to FIG. 3B, is a view showing a process of manufacturing the semiconductor device shown in FIG. 1A and FIG. 1B.

Next, as shown in FIG. 4, the semiconductor wafer is cut with a dicing blade 39 so that the sacrifice portions 22A, 23A, 24A have the width WB of, for example, 0.5 μm. Through this process, the semiconductor device shown in FIG. 1A and FIG. 1B is obtainable.

Figure 5:
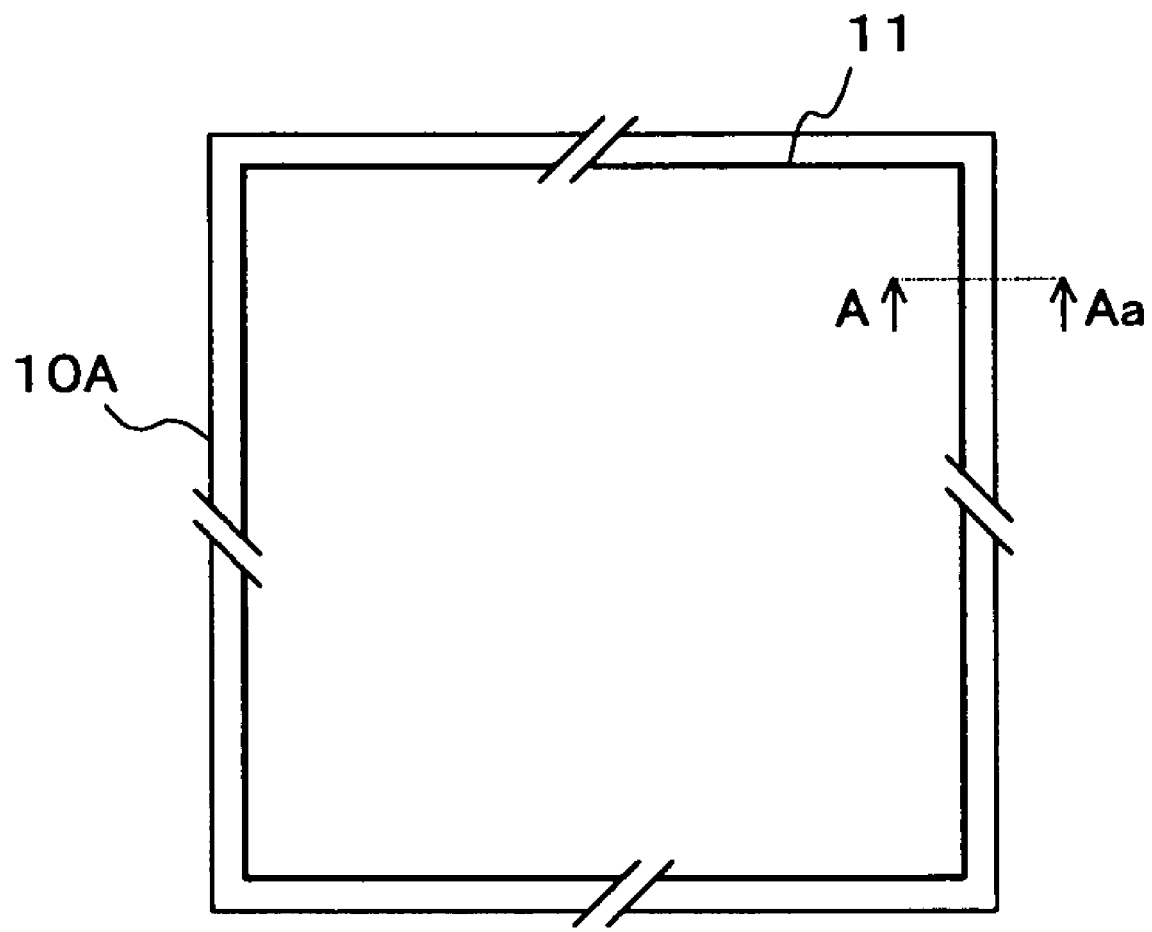
FIG. 5 is a top view showing a semiconductor device according to another embodiment of the present invention.

Next, an embodiment different from the embodiment shown in FIG. 1A and FIG. 1B will be explained with reference to FIG. 5. FIG. 5 is a top view showing a semiconductor device according to another embodiment of the present invention. In the semiconductor device according to this embodiment, a ring-shaped (circumferential) recession 11 is provided near the peripheral edge of a semiconductor chip 10A as shown in the drawing in place of the L-shaped recessions 11a, 11b, 11c, 11d. The structure of an A–Aa cross section in FIG. 5 is the same as that shown in FIG. 1B.

In this embodiment, the L-shaped lacking portions at four corners in the low-k interlayer insulating films 22, 23, 24 are connected to form a ring-shaped lacking portion extending along the peripheral edge of the semiconductor chip 10A. Therefore, the easy occurrence of peeling and breakage of the interlayer insulating films 22, 23, 24 is prevented not only in the vicinity of the four corners but also in other places. Therefore, resistance against peeling and breakage of the interlayer insulating films 22, 23, 24 caused by stress generation can be further enhanced.

Incidentally, in the embodiments shown in FIG. 1A, FIG. 1B, and FIG. 5, the shape of the lacking portions of the interlayer insulating films 22, 23, 24 near the four corners of the semiconductor chip is an L shape, but appropriate modification may be made within a permissible range of a lithography process. Any other shape may be adopted as long as at least the portions along the four corners of the semiconductor chip serve as the lacking portions so that the progress of film peeling can be blocked. Alternatively, plural lines of the lacking portions may be arranged from the four corners or the peripheral edge of the semiconductor chip toward a semiconductor substrate center side. Moreover, so-called guard rings may be separately provided inside the lacking portions to a semiconductor substrate center side, through synchronous processes as those for the wirings 21a, 22a, 23a, 24a, 25a (125a).

Figure 6A:
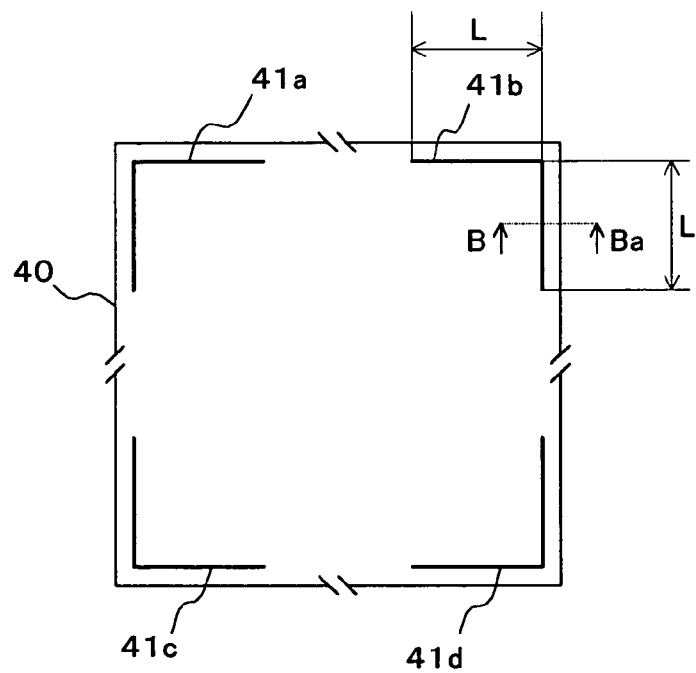
FIG. 6A and FIG. 6B are views schematically showing the structure of a semiconductor device according to still another embodiment of the present invention.
Figure 6B:
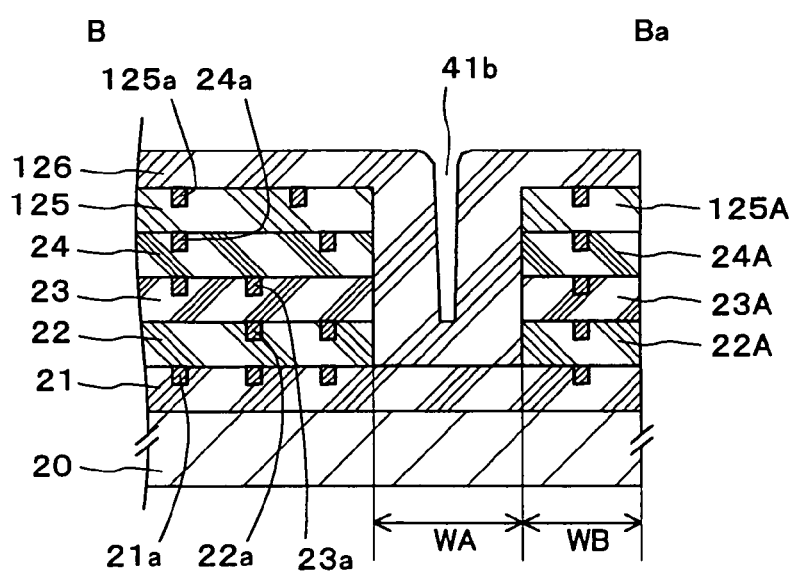

Next, an embodiment different from the embodiments shown in FIG. 1A, FIG. 1B, and FIG. 5 will be explained with reference to FIG. 6A and FIG. 6B. FIG. 6A and FIG. 6B are views schematically showing the structure of a semiconductor device according to still another embodiment of the present invention. FIG. 6A is a top view and FIG. 6B is a cross-sectional view taken along the B–Ba line shown in FIG. 6A. In FIG. 6A and FIG. 6B, the same reference numerals and symbols are used to designate portions that are the same as or corresponding to the portions previously explained, and explanation thereof will be omitted.

In this embodiment, L-shaped recessions 41a, 41b, 41c, 41d extending along four corners of a semiconductor chip 40 exist near the four corners thereof. A cross section near the recessions 41a, 41b, 41c, 41d has the structure as shown in FIG. 6B. Specifically, this structure is different from that of the semiconductor device in the embodiment shown in FIG. 1A and FIG. 1B in that lacking portions pass through not only low-k interlayer insulating films 22, 23, 24 but also through a normal interlayer insulating film 125 positioned thereabove. Wirings 125a are buried in the interlayer insulating film 125. The structure of the wirings 125a including vias is the same as that explained previously (the wirings 22a).

In such a semiconductor chip 40, sacrifice portions 125A are formed outside the lacking portions also in the normal interlayer insulating film 125. Further, a passivation film 126 made of SiN or the like is formed as the second insulating film on the entire surface including side faces and bottom faces of the lacking portions.

Manufacturing processes of such a structure will be described. First, the interlayer insulating film 125 is deposited and the wirings 125 are formed subsequently from the state shown in FIG. 2A. Then, in this layered state, the lacking portions are formed by a lithography technique and a RIE method. Then, the passivation film 126 is formed on the entire surface including the side faces and bottom faces of the lacking portions, so that the structure shown in the drawing is obtained. A process by laser ablation instead of the RIE method may be conducted.

Also in this embodiment, sacrifice portions 22A, 23A, 24A of low-k insulating films 22, 23, 24 are provided outside the lacking portions (dicing line side), so that it is possible to protect the low-k interlayer insulating films 22, 23, 24 from mechanical damage caused by crushed pieces at the dicing time. Further, film peeling of the sacrifice portions 22A 23A, 24A starting from cracks generated on dicing lines is blocked by the lacking portions, so that the peeling of the sacrifice portions 22A, 23A, 24A, even if it should occur, is prevented from progressing into the semiconductor chip 40.

Moreover, side faces of the interlayer insulating films 22, 23, 24 in the lacking portions on a semiconductor substrate 20 center side are covered with the passivation film 126 with a relative dielectric constant of over 3.8, so that not only environment resistance such as moisture resistance is enhanced but also mechanical strength is improved. Moreover, the passivation film 126 also covers side faces of the sacrifice portions 22A, 23A, 24A, 125A on a lacking portion side to serve as a barrier for preventing peeling that occurs in the sacrifice portions 22A, 23A, 24A, 125A from progressing inside, so that resistance against film peeling and film breakage is improved.

Next, the result of experiments conducted on the semiconductor devices as the above-described embodiments will be explained. The following four kinds of test objects were prepared: those as the embodiment shown in FIG. 1 and FIG. 1B in which the lacking portions were formed by a process using a RIE method (test objects 1); those as the embodiment shown in FIG. 6A and FIG. 6B in which the lacking portions were formed by a process using a RIE method (test objects 2); those as the embodiment shown in FIG. 1A and FIG. 1B in which the lacking portions were formed by a process using laser ablation (test objects 3); and those as the embodiment shown in FIG. 6A and FIG. 6B in which the lacking portions were formed by a process using laser ablation (test objects 4).

The semiconductor chips 10, 40 obtained after dicing were fixed on respective ceramic substrates with adhesive resin in a similar manner as a packaging process. Then, each of the semiconductor chips 10, 40 was electrically connected to a wiring board on a package side by wire bonding, and thereafter, the semiconductor chips 10, 40 were sealed with mold resin. 50 pieces of each of such samples 1, 2, 3, 4 (corresponding to the aforementioned test objects 1, 2, 3, 4 respectively) were prepared.

1000-cycle TCTs at 125° C. on a higher temperature side and −65° C. on a lower temperature side were conducted on each of the samples. In these tests, the samples were taken out every 1000-cycles and their electrical characteristics were measured to examine soundness thereof. As a result, no fault was observed in any of four kinds of the samples described above in the 1000-cycle tests.

The mold resin was removed in the samples that had undergone the TCTs, and the semiconductor chips 10, 40 were observed with an ultrasonic microscope. No peeling of the interlayer insulating films 22, 23, 24 was observed in any of the semiconductor chips 10, 40. Further, the semiconductor chips 10, 40 were cut to expose cross sections thereof and the cross sections were observed with a SEM (scanning electron microscope). Peeling starting from a diced end side was recognized in the sacrificing portions 22A, 23A, 24A, but it was found that the peeling generated from the diced end portion was stopped by the lacking portion.

Next, as a comparison example 1, structures made by a process in which the same multilayer wiring forming process as that of the above-described embodiments was used but no lacking portion was provided were diced with a diamond blade to obtain semiconductor chips. They were sealed in the above-described manner to be used as samples and TCTs were conducted thereon in the same manner.

In this case, continuity faults already occurred in 20% of the samples that had been sealed with mold resin but did not undergo the TCTs yet. Further, when the remaining samples that were sound at this instant were subjected to 100-cycle TCTs, all (100%) the samples incurred continuity faults. When the samples were disassembled and inspected after the 100-cycle TCTs, it was confirmed that interlayer insulating films at four corners of each chip peeled and the peeling progressed from an end portion diced with the diamond blade. In addition, when each chip was cut and its cross section was observed, the peeled interface was an interface between a low-k film and a top barrier film.

Next, as comparison examples 2, 3, the following structures were prepared: structures made by the same process as that of the embodiment shown in FIG. 1A and FIG. 1B except that the depth of the lacking portions was set such that the interlayer insulating film 22 (the lower most layer low-k film) was left unpenetrated; and structures made by the same process as that of the embodiment shown in FIG. 1A and FIG. 1B except that the depth of the lacking portions was set such that the interlayer insulating film 23 (the intermediate layer low-k film) was left unpenetrated. They were diced with a diamond blade to obtain semiconductor chips. Then, these semiconductor chips were sealed in the above-described manner to be used as samples, and these samples were subjected to the same TCTs.

Also in this case, similarly to the comparison example 1, in a continuity test conducted on the samples that had been sealed with mold resin but did not undergo the TCTs yet, faults were recognized in 20% of the samples. After 100-cycle TCTs, continuity faults occurred in 100% of the samples. This has made it clear that, in order to prevent peeling of a low-k interlayer insulating film, it is necessary to form the lacking portions on an inner side than the dicing cut end on the chip and it is also necessary to set the depth of the lacking portions such that the lacking portions pass through all the layers of the low-k interlayer insulating films.

Next, the result of experiments conducted for the purpose of studying a desired value of the width WA of the lacking portion will be discussed. In the samples 2, the width WA of the lacking portion in the semiconductor chip 40 was set to 0.2 µm, 0.5 µm, 1 µm, 2 µm, and 5 µm (note that the width of the sacrifice portions was 0.5 µm), thereby preparing five kinds of samples. The result of TCTs under the above-mentioned temperature cycle conditions conducted on five kinds of the samples did not show any fault even after 1000-cycle tests.

Further, as a result of accelerated tests as moisture resistance tests conducted at 100° C. under the condition in which an 100% $H_2O$ environment was kept, continuity faults occurred in 5% of the samples with WA=0.2 µm after undergoing a 500-hour test. When the semiconductor chips 40 was cut to expose its cross section and this fault was examined, it was confirmed that the passivation film 126 did not reach the bottom portion and corrosion occurred in the wirings 22a, 23a, 24a of the low-k interlayer insulating films 22, 23, 24. Therefore, it was made clear that this fault was caused by insufficient passivation covering.

The foregoing results can lead to the conclusion that, though as for peeling of the interlayer insulating films, no dependency on the width WA of the lacking portions was seen, the width WA is desirably set to 0.5 µm or more in view of corrosion resistance.

Next, the result of experiments conducted for the purpose of studying a desired value of the width WB of the sacrifice portions will be discussed. In the samples 1, the width WB of the sacrifice portions in the semiconductor chip 10 was set to 0.2 µm, 0.3 µm, 0.5 µm, 1 µm, 2 µm, and 5 µm (note that the width WA of the lacking portions was 0.5 µm), thereby preparing six kinds of samples. The result of TCTs under the aforesaid temperature cycle conditions conducted on these six kinds of the samples showed that faults occurred in 2% of each of two kinds of the samples with WB=0.2 µm and 0.3 µm after 1000-cycle tests. On the other hand, no fault occurred in any of the samples having the sacrifice portions with WB=0.5 µm or more.

The foregoing results can lead to the conclusion that the width WB of the sacrifice portions is desirably set to 0.5 µm or more. Incidentally, for reference, when the same tests were conducted on samples having the same structure as that of the samples 2 but having the sacrifice portions with the width WB=0, faults also occurred in 2% of the samples after 1000-cycle tests, and therefore, the sacrifice portions are necessary. In this case, as a result of analyzing the faults, it was found that peeling occurred because crushed pieces made by dicing gave direct mechanical damage to the passivation film 126 covering the side faces of the interlayer insulating films 22, 23, 24.

Further, the result of experiments conducted for the purpose of studying a desired value of the length of one side of the lacking portion (corresponding to the length L of one side of the recession resulting from the lack of the interlayer insulating film) will be discussed. Samples which were made by the same process as that of the samples 1, 2, 3, 4 but in which the length of one side of the lacking portion of the interlayer insulating films 22, 23, 24 was set to 1 mm were prepared. The result of TCTs conducted on these samples under the aforesaid temperature cycle conditions showed no occurrence of faults even after 1000-cycle tests. This can lead to the conclusion that the length of one side of the lacking portions is desirably 1 mm or more.

Incidentally, providing the lacking portions in the low-k interlayer insulating films 22, 23, 24 as shown in the embodiments also brings about an effect of reducing warp of a semiconductor wafer that are undergoing manufacturing processes, though not explained in the above-described embodiments. This is because the low-k interlayer insulating films 22, 23, 24 are separated at least at several places on the wafer, and the reduction in warp can eliminate such an adverse effect that it becomes difficult to apply subsequent processes due to the warp.

The present invention is not to be limited to the specific forms described with the illustrations here, and it should be understood that all changes which come within the meaning and range of equivalency of the following claims are intended to be embraced therein.

What is claimed is:

1. A semiconductor device comprising:
   a semiconductor substrate having a Periphery and a center;
   at least one layer of a first insulating film formed above the semiconductor substrate and having a relative dielectric constant of 3.8 or less, an entire layer of the first insulating film being separated at least near four corners of the semiconductor substrate by a lacking portion that extends alone the four corners;
   a second insulating film covering a side face of the entire layer of the first insulating film in the lacking portion on a side of the center of the semiconductor substrate and having a relative dielectric constant of over 3.8; and
   a conductor film layered on the second insulating film in the lacking portion.

2. A semiconductor device as set forth in claim 1, wherein the lacking portion in the first insulating film is formed near an entire peripheral edge of the semiconductor substrate.

3. A semiconductor device as set forth in claim 1, wherein the second insulating film covers a side face of the entire layer of the first insulating film in the lacking portion also on a side of the periphery of the semiconductor substrate.

4. A semiconductor device as set forth in claim 1, further comprising a third insulating film layered on the conductor film and having a relative dielectric constant of over 3.8.

5. A semiconductor device comprising:
   a semiconductor substrate having a periphery and a center;
   at least one layer of a first insulating film formed above the semiconductor substrate and having a relative dielectric constant of 3.8 or less, an entire layer of the first insulating film being separated at least near four corners of the semiconductor substrate by a lacking portion that extends along the four corners;
   a second insulating film covering a top face of the first insulating film and a side face of the entire layer of the first insulating film in the lacking portion on a side of the center of the semiconductor substrate and having a relative dielectric constant of over 3.8; and
   a conductor pattern passing through the second insulating film on the top face of the first insulating film.

6. A semiconductor device as set forth in claim 5, further comprising a second conductor pattern buried in the first insulating film.

7. A semiconductor device as set forth in claim 5, wherein the conductor pattern contains copper.

8. A semiconductor device as set forth in claim 1, wherein the first insulating film is constituted of a plurality of layers.

9. A semiconductor device as set forth in claim 1, wherein the lacking portion in the first insulating film has a width of 0.5 µm or more.

10. A semiconductor device as set forth in claim 1, wherein the first insulating film between the lacking portion and the periphery of the semiconductor substrate has a width of 0.5 µm or more.

11. A semiconductor device as set forth in claim 1, wherein a side of the lacking portion in the first insulating film has a length of 1 mm or more.

12. A semiconductor device comprising:
    a semiconductor substrate;
    at least one layer of a first insulating film formed above the semiconductor substrate and having a relative dielectric constant of 3.8 or less, an entire layer of the first insulating film being separated at least near four corners of a semiconductor chip by a lacking portion that extends along the four corners;
    a second insulating film formed in the lacking portion and on the first insulating film and having a relative dielectric constant of over 3.8; and
    a conductor film layered on the second insulating film in the lacking portion.

13. A semiconductor device as set forth in claim 12, wherein the lacking portion in the first insulating film is formed near an entire peripheral edge of the semiconductor chip.

14. A semiconductor device as set forth in claim 12, further comprising a third insulating film layered on the conductor film and having a relative dielectric constant of over 3.8.

15. A semiconductor device as set forth in claim 12, wherein the first insulating film is constituted of a plurality of layers.

16. A semiconductor device as set forth in claim 12, wherein the lacking portion in the first insulating film has a width of 0.5 µm or more.

17. A semiconductor device as set forth in claim 12, wherein the first insulating film between the lacking portion and a peripheral edge of the semiconductor chip has a width of 0.5 µm or more from the lacking portion.

18. A semiconductor device as set forth in claim 12, wherein a side of the lacking portion in the first insulating film has a length of 1 mm or more.

19. A semiconductor device as set forth in claim 5, wherein the lacking portion in the first insulating film is formed near an entire peripheral edge of the semiconductor substrate.

20. A semiconductor device as set forth in claim 5, wherein the second insulating film covers a side face of the entire layer of the first insulating film in the lacking portion on a side of the periphery of the semiconductor substrate.

21. A semiconductor device as set forth in claim 5, further comprising a conductor film layered on the second insulating film in the lacking portion.

22. A semiconductor device as set forth in claim 5, wherein the first insulating film comprises a plurality of layers.

23. A semiconductor device as set forth in claim 5, wherein the lacking portion in the first insulating film has a width of 0.5 µm or more.

24. A semiconductor device as set forth in claim 5, wherein the first insulating film between the lacking portion and the periphery of the semiconductor substrate has a width of 0.5 µm or more.

25. A semiconductor device as set forth in claim 5, wherein a side of the lacking portion in the first insulating film has a length of 1 mm or more.

* * * * *

UNITED STATES PATENT AND TRADEMARK OFFICE
CERTIFICATE OF CORRECTION

| | | |
|---|---|---|
| PATENT NO. | : 7,067,922 B2 | |
| APPLICATION NO. | : 10/809418 | |
| DATED | : June 27, 2006 | |
| INVENTOR(S) | : Hasunuma et al. | |

It is certified that error appears in the above-identified patent and that said Letters Patent is hereby corrected as shown below:

Claim 1, column 13, line 8, change "Periphery" to --periphery--.

Claim 1, column 13, line 15, change "alone" to --along--.

Signed and Sealed this

Fifth Day of December, 2006

JON W. DUDAS
*Director of the United States Patent and Trademark Office*